(12) United States Patent
Kanamori et al.

(10) Patent No.: US 7,580,293 B2
(45) Date of Patent: Aug. 25, 2009

(54) SEMICONDUCTOR MEMORY DEVICE

(75) Inventors: Kohji Kanamori, Kanagawa (JP);
Kenichi Kuboyama, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 11/700,186

(22) Filed: Jan. 31, 2007

(65) Prior Publication Data
US 2007/0183222 A1    Aug. 9, 2007

(30) Foreign Application Priority Data
Feb. 9, 2006    (JP) .............................. 2006-032558

(51) Int. Cl.
*G11C 16/04* (2006.01)
(52) U.S. Cl. .................. 365/185.29; 365/185.14; 365/185.15; 365/185.27
(58) Field of Classification Search ............. 365/185.29
See application file for complete search history.

(56) References Cited

U.S. PATENT DOCUMENTS

| | | | | |
|---|---|---|---|---|
| 6,493,262 B1 * | 12/2002 | Wald et al. | ............. | 365/185.29 |
| 2002/0008277 A1 * | 1/2002 | Chen | ............. | 257/315 |
| 2002/0019097 A1 * | 2/2002 | Arai et al. | ............. | 438/257 |
| 2003/0071301 A1 * | 4/2003 | Wald et al. | ............. | 257/314 |
| 2005/0029577 A1 | 2/2005 | Nishizaka et al. | | |
| 2006/0083066 A1 * | 4/2006 | Hasegawa et al. | ......... | 365/185.18 |

FOREIGN PATENT DOCUMENTS

JP        2005-51227        2/2005

* cited by examiner

*Primary Examiner*—Son L Mai
(74) *Attorney, Agent, or Firm*—McGinn IP Law PLLC

(57) ABSTRACT

A programmable non-volatile semiconductor memory device includes a select gate 3, arranged in a first region on a substrate, a floating gate 6 arranged in a second region neighboring to the first region, a first diffusion region 7 provided in a third region neighboring to the second region, a control gate 11 arranged on the floating gate 6, and a driving circuit 22 adapted for controlling voltages applied to the substrate 1 (well 1a), select gate 3, first diffusion region 7 and control gate 11. The driving circuit performs control so that, during erasure operation, voltages applied to select gate 3 and the control gate 11 are negative, with the remaining voltage, applied to the substrate 1 (or well 1a), being positive. The device permits erasure operation at a lower voltage.

21 Claims, 9 Drawing Sheets

(EXAMPLE 1)

(EXAMPLE 1)

[X–X']

(EXAMPLE 1)

(EXAMPLE 1)

[FIRST ERASURE OPERATION]

(EXAMPLE 1)

[SECOND ERASURE OPERATION]

(EXAMPLE 1)
[THIRD ERASURE OPERATION]

(EXAMPLE 1)

(RELATED ART 1)

[FIRST ERASURE OPERATION]

(RELATED ART 1)
[SECOND ERASURE OPERATION]

SEMICONDUCTOR MEMORY DEVICE

FIELD OF THE INVENTION

This invention relates to a semiconductor memory device and, more particularly, to a programmable non-volatile semiconductor memory device.

BACKGROUND OF THE INVENTION

Among known non-volatile semiconductor memory devices, there is such a one shown in FIG. 8 (related art 1; see Patent document 1). The non-volatile semiconductor memory device, pertaining to the related art 1, includes, in its memory cell array, a plural number of first diffusion regions 107, a plural number of select gates 103, a plural number of floating gates 106 and a plural number of control gates 111.

The first diffusion regions 107 extend in one direction on the surface of a substrate 101 and are separated one from another. The first diffusion regions 107 are used as local bitlines (LB). The select gates (SG) 103 are arranged in regions on the substrate sandwiched between neighboring ones of the first diffusion regions 107, with the interposition of a plural number of insulating films 102, and are extended along the extending directions of the first diffusion regions 107. The floating gates (FG) 106 are storage nodes and are arranged in regions defined between the first diffusion regions 107 and the select gates 103, with the interposition of the insulating films 102. When seen in a plan view, the floating gates look like islands. The control gates (CG) 111 are arranged on the top of the floating gates 106 and the select gates 103, with the interposition of a plural number of insulating films 108. The control gates 111 are arranged in juxtaposition, with an interval from one another, and are extended in a direction of crossing the select gates 103. The control gates 111 are used as wordlines.

One 107 out of the first diffusion regions 107, lying on either sides of the select gate 103, the floating gate 106, the control gate 111 and the select gate 103 make up a first unit cell. The other 107 of the first diffusion regions 107, lying on either sides of the select gate 103, the floating gate 106, the control gate 111 and the select gate 103, make up a second unit cell. The first diffusion region 107 is shared by a plural number of unit cells. With this non-volatile semiconductor memory device, an inversion layer 120 is formed on the surface of the substrate 101 below the select gate 103 in the cell region.

The voltages applied to the first diffusion region 107, select gate 103, control gate 111 and to the substrate 101 (well 101a) is controlled by a driving circuit, not shown, constituting a portion of a peripheral circuit in the semiconductor memory device.

The erasure operation by the non-volatile semiconductor memory device, according to the related art 1, is described as follows.

Referring to FIG. 8, in the first erasure operation, a high negative voltage is applied to the control gate 111, whilst a high positive voltage is applied to the substrate 101 (well 101a). For example, a voltage $V_{cg}=-9V$ is applied to the control gate 111, and a voltage $V_{sub}=9V$ is applied to the substrate 101 (well 101a). The first diffusion region 107 and the select gate 103 are open. In this state, electrons e are extracted from the floating gate 106 to the substrate 101 (well 101a) as shown by the arrows e. The potential $V_{fg}$ of the floating gate 106 at the time of the first erasure operation can be calculated by the following equation 1:

$$Vfg = \frac{Q}{Call} + \frac{Ccf}{Call}Vcg + \frac{Cfsub}{Call}Vsub \quad \text{[Equation 1]}$$

$$Call = Ccf + Csf + Cfsub$$

$$Vcg < 0V, Vsg = \text{open} \equiv 0V, Vsub > 0V$$

where Q denotes the quantity of electricity of the floating gate 106, $C_{cf}$ denotes the capacitance between the control gate 111 and the floating gate 106, $C_{fsub}$ denotes the capacitance between the floating gate 106 and the substrate 101, and $C_{sf}$ denotes the capacitance between the select gate 103 and the floating gate 106.

Referring to FIG. 9, in the second erasure operation, a negative high voltage is applied to the control gate 111, and a positive voltage is applied to the select gate 103. For example, a voltage $V_{cg}=-9V$ is applied to the control gate 111, and a voltage $V_{sg}=3V$ is applied to the select gate 103, whilst the first diffusion region 107 and the substrate 101 (well 101a) are open. In this state, electrons e are extracted from the floating gate 106 to the select gate 103 as shown by arrows e. The potential $V_{fg}$ of the floating gate 106 at the time of the second erasure operation can be calculated by the following equation 2:

$$Vfg = \frac{Q}{Call} + \frac{Ccf}{Call}Vcg + \frac{Csf}{Call}Vsg \quad \text{[Equation 2]}$$

$$Call = Ccf + Csf + Cfsub$$

$$Vcg < 0V, Vsg > 0V, Vsub = \text{open} \equiv 0V$$

where Q denotes the quantity of electricity of the floating gate 106, $C_{cf}$ denotes the capacitance between the control gate 111 and the floating gate 106, $C_{fsub}$ denotes the capacitance between the floating gate 106 and the substrate 101, and $C_{sf}$ denotes the capacitance between the select gate 103 and the floating gate 106.

[Patent document 1] JP Patent Kokai Publication No. JP-P2005-51227A

The disclosure of the Patent document 1 is herein incorporated by reference thereto.

SUMMARY OF THE DISCLOSURE

However, with the erasure operation according to the related art 1, shown in FIGS. 8 and 9, there is fear that the voltage applied to the control gate 111, the substrate 101 and to the select gate 103 is increased. That is, with the first erasure operation of FIG. 8, the applied voltage is determined by the capacitance coupling ratio between the capacitance coupling between the floating gate 106 and the control gate 111 and that between the floating gate 106 and the substrate 101, without contribution from the capacitance coupling between the select gate 103 and the floating gate 106. Hence, there is a risk that the voltage applied to the control gate 111 and to the substrate 101 is increased. On the other hand, with the second erasure operation of FIG. 9, the applied voltage is determined by the capacitance coupling ratio between the capacitance coupling between the floating gate 106 and the control gate 111 and that between the floating gate 106 and the select gate 103, without contribution from the capacitance coupling between the substrate 101 and the floating gate 106. Hence, there is a risk that the voltage applied to the control gate 111 and to the select gate 103 is increased. If the applied voltage is that high, there is fear that the peripheral circuit is increased in size.

It is a principal object of the present invention to provide a semiconductor memory device in which an erasure operation may be carried out at a lower voltage.

According to the present invention, there is provided a semiconductor memory device including a select gate arranged in a first region on a substrate; a storage node arranged in a second region neighboring to the first region; a first diffusion region provided in a third region neighboring to the second region; a control gate arranged on the storage node; and a driving circuit that controls a voltages applied to the substrate, select gate, first diffusion region and control gate. The driving circuit performs control so that, during an erasure operation, two of three voltages, that is, a voltage applied to the substrate or the first diffusion region, a voltage applied to the select gate and a voltage applied to the control gate, will be negative, and the remaining voltage will be positive.

According to a second mode, the driving circuit may exercise control so that, during the erasure operation, the voltages of the select gate and the control gate will be negative, and the voltage of the substrate or the first diffusion region will be positive.

According to a third mode, the driving circuit may exercise control so that, during the erasure operation, the voltage of the substrate or the first diffusion region and the voltage of the control gate will be negative and the voltage of the select gate will be positive.

According to a fourth mode, the driving circuit may exercise control so that, during the erasure operation, the voltage of the select gate and the voltage of the substrate or the first diffusion region will be negative, and the voltage of the control gate will be positive.

According to a fifth mode, during the erasure operation, a voltage of the same polarity as that of the voltage applied to the substrate may be applied by the driving circuit to the first diffusion region.

The meritorious effects of the present invention are summarized as follows.

According to the present invention, set forth in modes 1 to 5, it is possible to use lower voltages as the voltages applied to the select gate, substrate (well) and control gate at the time of electron extraction by tunneling from the storage node. The peripheral circuit may be reduced in size as a result of lowering the voltages applied. The reason is that a voltage and an electrical field such that electrons may be extracted to the substrate side under a lower applied voltage can be generated by three capacitive couplings, namely a capacitive coupling between the control gate and the storage node, a capacitive coupling between the select gate and the storage node and a capacitive coupling between the substrate (well) or the first diffusion region and the storage node. On the other hand, the erasure operation may be increased in speed by increasing the voltages applied to the select gate, to the substrate (well) or the first diffusion region, or to the control gate.

BRIEF DESCRIPTIONS OF THE DRAWINGS

PREFERRED MODES OF THE INVENTION

EXAMPLE 1

Figure 1:
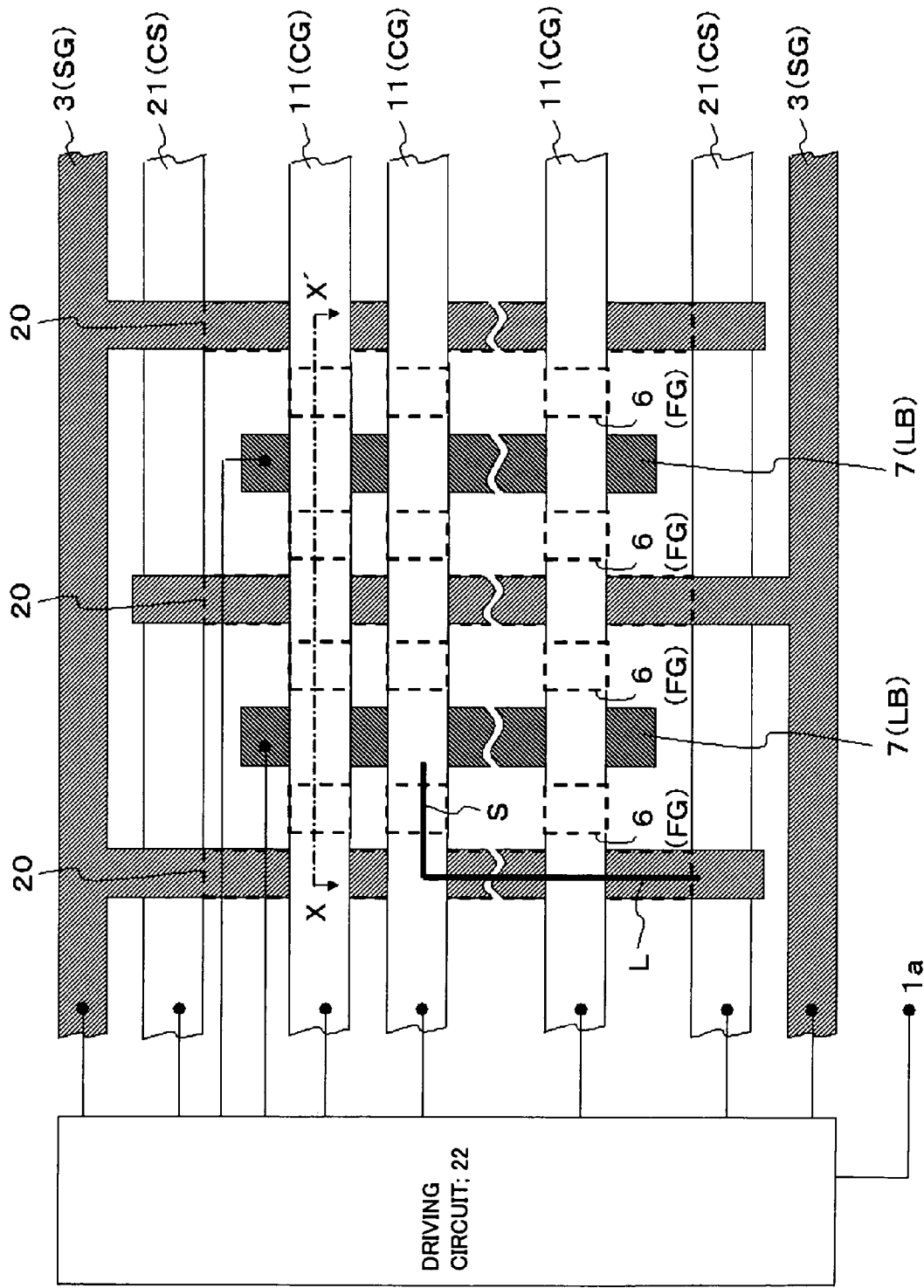
FIG. 1 is a partial plan view schematically showing the constitution of a semiconductor memory device according to a first example of the present invention.
Figure 2:
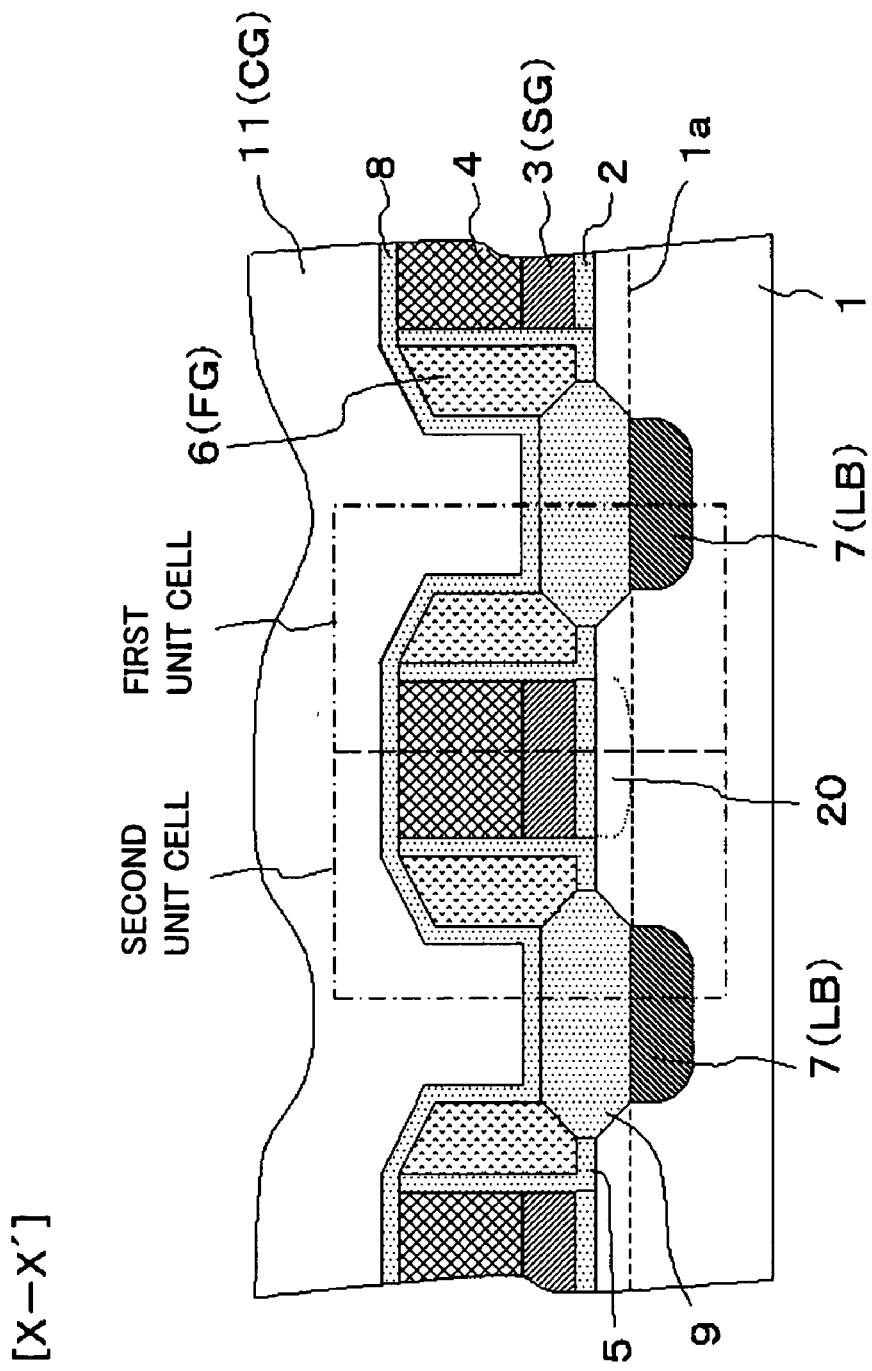
FIG. 2 is a partial cross-sectional view taken along line X-X' of FIG. 1 showing the constitution of a semiconductor memory device according to the first example of the present invention.
Figure 3:
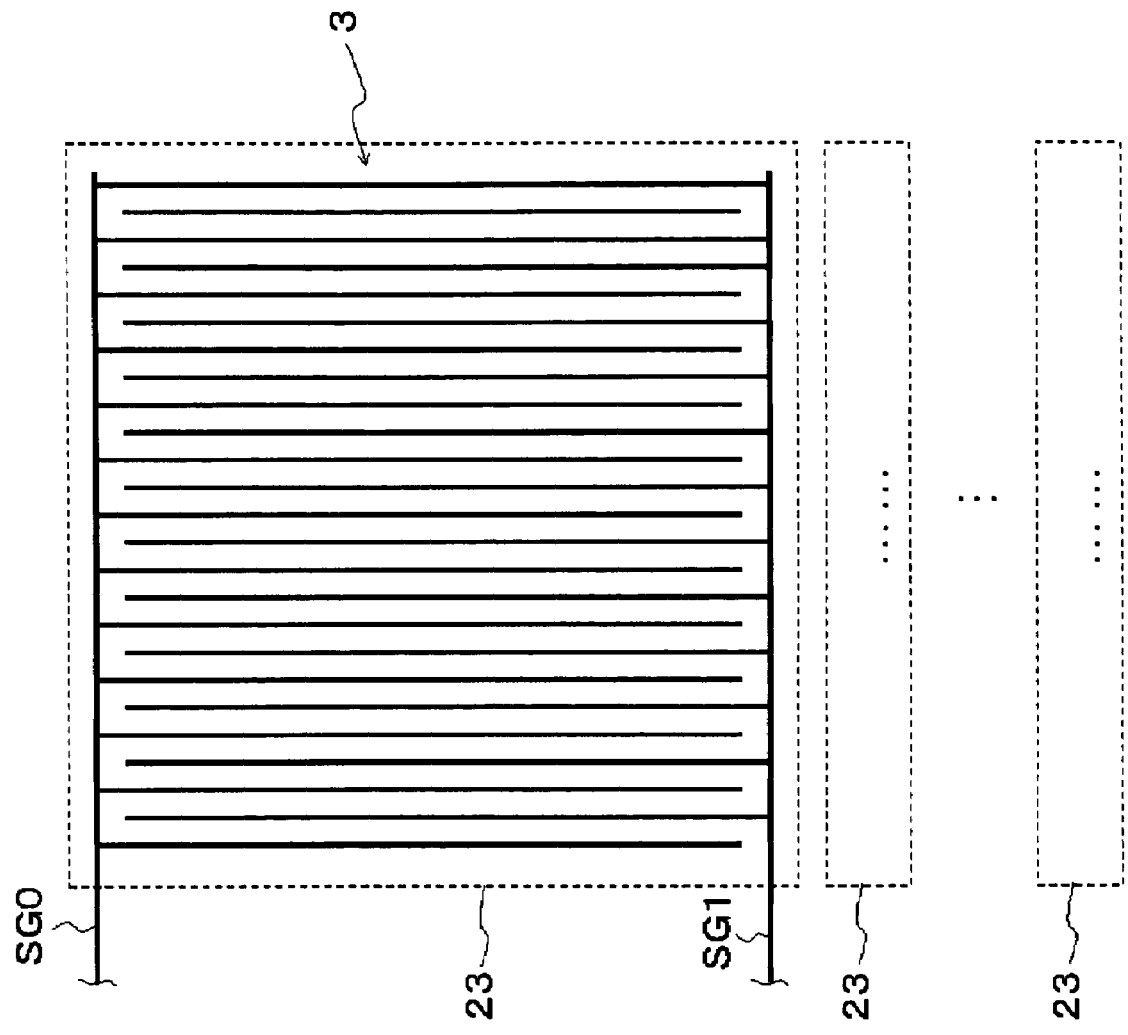
FIG. 3 is a partial plan view showing the constitution of a select gate in an erasure block of the semiconductor memory device according to the first example of the present invention.

A semiconductor memory device according to a first example of the present invention will now be described with reference to the drawings. FIG. 1 is a partial plan view schematically showing the constitution of a semiconductor memory device according to a first example of the present invention. FIG. 2 is a schematic partial cross-sectional view, taken along line X-X' of FIG. 1, illustrating the semiconductor memory device according to the first example of the present invention. FIG. 3 is a partial plan view schematically showing the constitution of a select gate in an erasure block of the semiconductor memory device according to the first example of the present invention.

The semiconductor memory device according to the first example is a non-volatile semiconductor memory device for storing the 2-bit information per cell. The semiconductor memory device includes a substrate 1, an insulating film 2, a select gate 3, an insulating film 4, an insulating film 5, a floating gate 6, a first diffusion region 7, an insulating film 8, an insulating film 9, a control gate 11, a second diffusion region 21 (FIG. 1) and a driving circuit 22. In the semiconductor memory device, a unit cell is made up by one of the first diffusion regions 7, one of the floating gates 6, the control gate 11 and the select gate 3, as indicated by a chain-dotted line in FIG. 2. In the semiconductor memory device, the 2-bit cells are constituted by two unit cells, arranged with line symmetry, with one of the select gates 3 being used in common. That is, in FIG. 2, the other unit cell of the 2-bit cell is made up of one of the first diffusion regions 7, one of the floating gates 6, the control gate 11 and the select gate 3.

The substrate 1 is a P-type silicon substrate. The substrate 1 includes a well 1a below the select gate 3 and the floating gate 6. The well 1a is a p⁻type diffusion region. The well 1a is also termed a "common source diffusion region".

In the substrate 1, a channel constituting a path interconnecting the first diffusion region 7 and the second diffusion region 21 includes a first path section L and a second path section S, when the substrate 1 is viewed from above. The first path section L is formed by extending from one of the second diffusion regions 21 along a first direction as defined in association with the planar shape of the select gate 3. The end of the first path section L, extending from the second diffusion region 21, is bent to form the second path section S extending as far as the first diffusion region 7 along a second direction forming a preset angle, such as a right angle, with respect to the first direction. A channel of the first path section L below the select gate 3 within the cell region becomes an inversion layer 20 when the positive voltage is applied to the select gate 3. In the second path section S, the region below the floating gate 6 also is used as a channel region. In the similar manner, a channel region constituting a path interconnecting the first diffusion region 7 and the second diffusion region 21 includes a first path section and a second path section, when the substrate 1 is viewed from above. The first path section L is formed by extending from one of the second diffusion regions 21 along the longitudinal direction of the select gate 3. The end of the first path section, extending from the second diffusion region 21, is bent at a preset angle, such as a right angle, with respect to the first direction, in order to form the second path section extending as far as the first diffusion region 7.

The insulating film 2 is provided between the select gate 3 and the substrate 1. The insulating film 2 may be formed by, for example a silicon oxide film, and is sometimes referred to herein as a select gate insulating film.

The select gate (SG) 3 is an electrically conductive film provided on the insulating film 2. As the material for the select gate 3, polysilicon, for example, may be used. The select gate 3 includes a pair of select gate sections SG0 and SG1 in one erasure block 23 (see FIG. 3). The select gate sections SG0 and SG1 are each formed as a comb when viewed along a direction of a line normal to the plane. The comb teeth of the select gate section SG0 are intruded into the space between the comb teeth of the select gate section SG1 at a predetermined interval. The select gate sections SG0 and SG1 are electrically connected to all of the unit cells in each erasure block 23. It is noted that the erasure block 23 is made up of a plural number of unit cells. That is, the erasure block 23 is made up of the unit cells from all of the floating gates 6 of which electrons are extracted simultaneously in the event of an erasure operation. There are a plural number of such erasure blocks 23 in the semiconductor memory device. In this example, the select gates are grouped into two select gate groups of SG0 and SG1. However, the select gates 3 may be divided into three or more select gate groups in one erasure block.

The insulating film 4 is provided on the silicon gate 3 (FIG. 2). The insulating film 4 may, for example, be a silicon oxide film or a silicon nitride film.

The insulating film 5 is formed on a sidewall section of the insulating film 4, on a sidewall section of the select gate 3, on a sidewall section of the insulating film 2, and between the substrate 1 and the floating gate 6. The insulating film 5 may, for example, be a silicon oxide film (FIG. 2), and is also referred to as a tunnel oxide film.

The floating gate 6 functions as a storage node, and is provided, via insulating film 5, on both sides of a select gate structure formed by a stack of the select gate 3 and the insulating film 4 (FIG. 2). The floating gate 6 may, for example, be formed of polysilicon. When seen in a cross-sectional view, the floating gates 6 appear like sidewalls (FIG. 2) and, when the floating gate is viewed in a plan view, they appears like islands (FIG. 1).

The first diffusion region 7 is an $n^+$ diffusion area, formed in a predetermined region (a region between neighboring floating gates 6) of the substrate 1, and is arranged along a direction of extension of the select gates 3, more specifically, the combs of the select gates (FIGS. 1 and 2). The first diffusion region 7 is in the specific association with the select gate 3 so that, during programming, the first diffusion region becomes a drain region of a cell transistor and, during readout, the first diffusion region becomes its source region. The first diffusion region 7 is also termed a local bitline (LB).

The insulating film 8 is disposed between the floating gate 6 and the control gate (CG) 11, and may further extend over the insulating film 4 (FIG. 2). The insulating film 8 may, for example, be an ONO film, formed by a silicon oxide film 8a, a silicon nitride film 8b and a silicon oxide film 8c. The insulating film 8 is high in insulating performance and has a specific dielectric constant and contributes to reduction of film thicknesses.

The insulating film 9 is provided between the insulating film 8 and the first diffusion region 7 (FIG. 2). As the insulating film 9, a silicon oxide film formed by thermal oxidation (thermally oxidized film) or a silicon oxide film formed by a CVD method, may be used.

The control gate 11 is extended in a direction perpendicular to the longitudinal direction of the select gate 3, and crosses the select gate 3 with an overpass (FIG. 1). In a crossing section with the select gate 3, the control gate 11 is contacted with an upper surface of the insulating film 8 provided as an upper layer of the select gate 3 (FIG. 2). The control gate 11 is provided via insulating layer 5, floating gate 6 and insulating layer 8 on each side of the select gate structure made up of a laminate of the select gate 3 and the insulating layer 4 (FIG. 2). The control gate 11 is formed by an electrically conductive film and may, for example, be formed of polysilicon. A metal silicide having a high melting point, not shown, may be provided on the surface of the control gate 11 to provide for low resistance. The control gate 11 operates as a word line.

The second diffusion region 21 is an $n^+$ diffusion region and becomes a source/drain region of a cell transistor (FIG. 1). The second diffusion region (CS) 21 is provided outside the cell region for extending perpendicular to the longitudinal direction of the select gate 3 and crosses the select gate 3 with an underpass. The second diffusion region 21 is formed, at a crossing point with the select gate 3, on a surface layer of the substrate 1 directly below the insulating film 2, which is provided as a lower layer of the select gate 3, in a manner not shown.

A driving circuit 22 is part of a peripheral circuit, and controls the voltages applied to the first diffusion region 7, select gate 3, control gate 11, substrate 1 (well 1a) and to the second diffusion region 21. It is noted that the voltage control by the driving circuit 22 differs, at least in its erasure operation, from the voltage control by the driving circuit of the non-volatile semiconductor memory device according to the related art 1. The voltage control in the erasure operation by the driving circuit 22 will be explained subsequently.

The semiconductor memory device of the first example is similar in constitution to the non-volatile semiconductor memory device according to the related art 1, except for the driving circuit 22. Also, the semiconductor memory device of the first example may be fabricated by a method which is similar in the fabrication process from the stage of forming the well 1a up to the stage of forming the control gate 11 to the method for fabricating the non-volatile semiconductor memory device according to the related art 1. In this connection, the reference is made to the disclosure of Patent document 1 which is incorporated herein by reference thereto.

Figure 4:
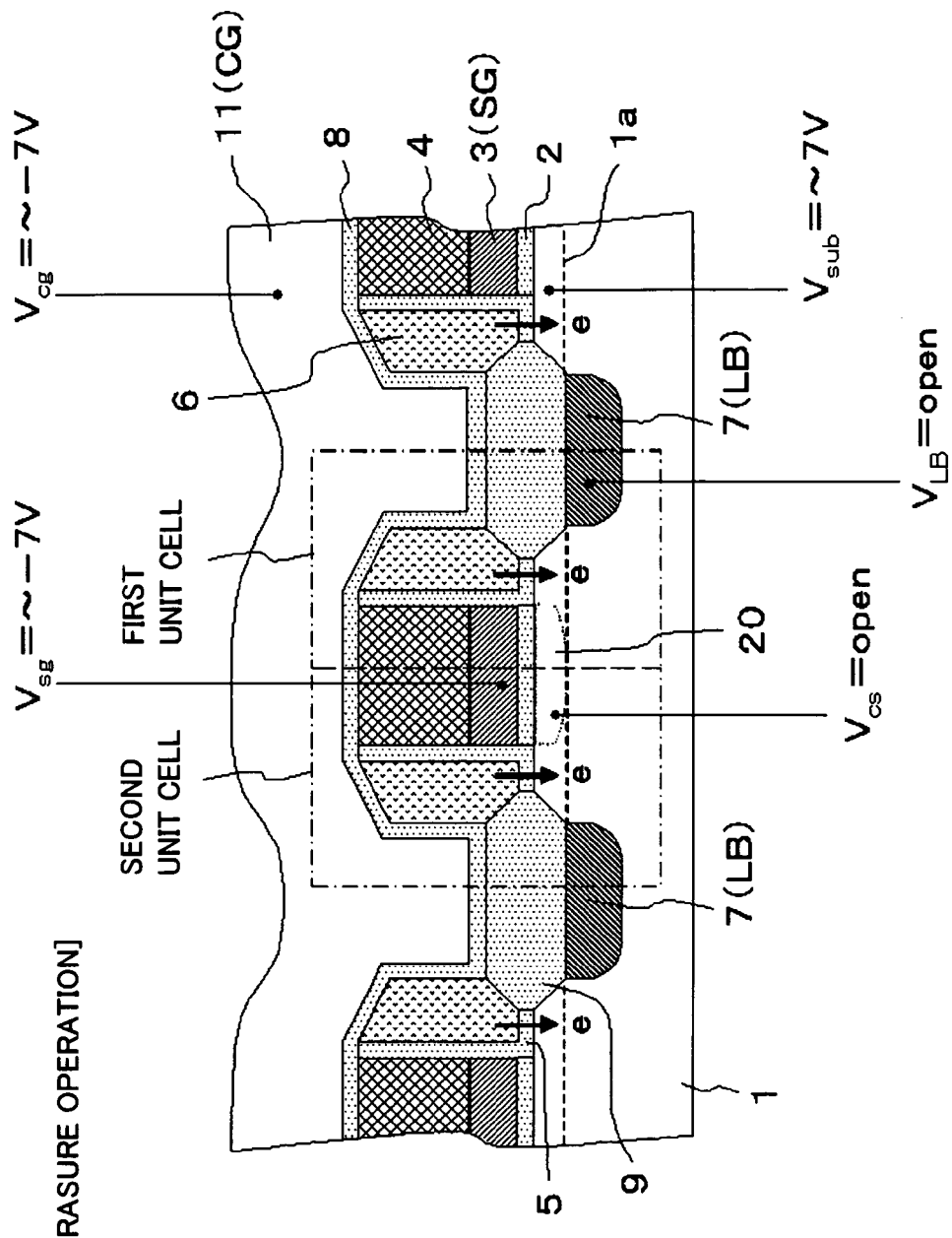
FIG. 4 is a schematic view for illustrating a first erasure operation of the semiconductor memory device according to the first example of the present invention.
Figure 5:
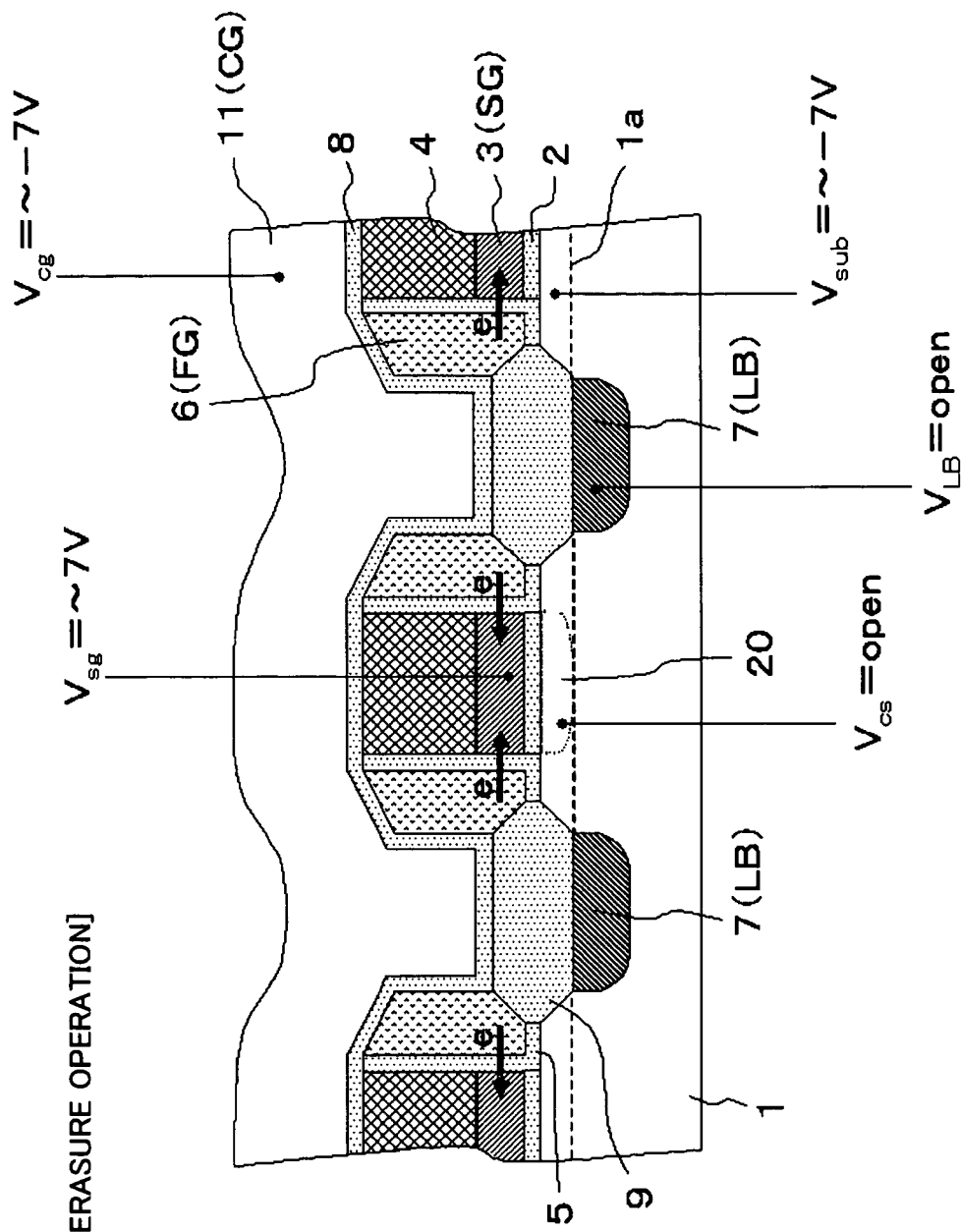
FIG. 5 is a schematic view for illustrating a second erasure operation of the semiconductor memory device according to the first example of the present invention.
Figure 6:
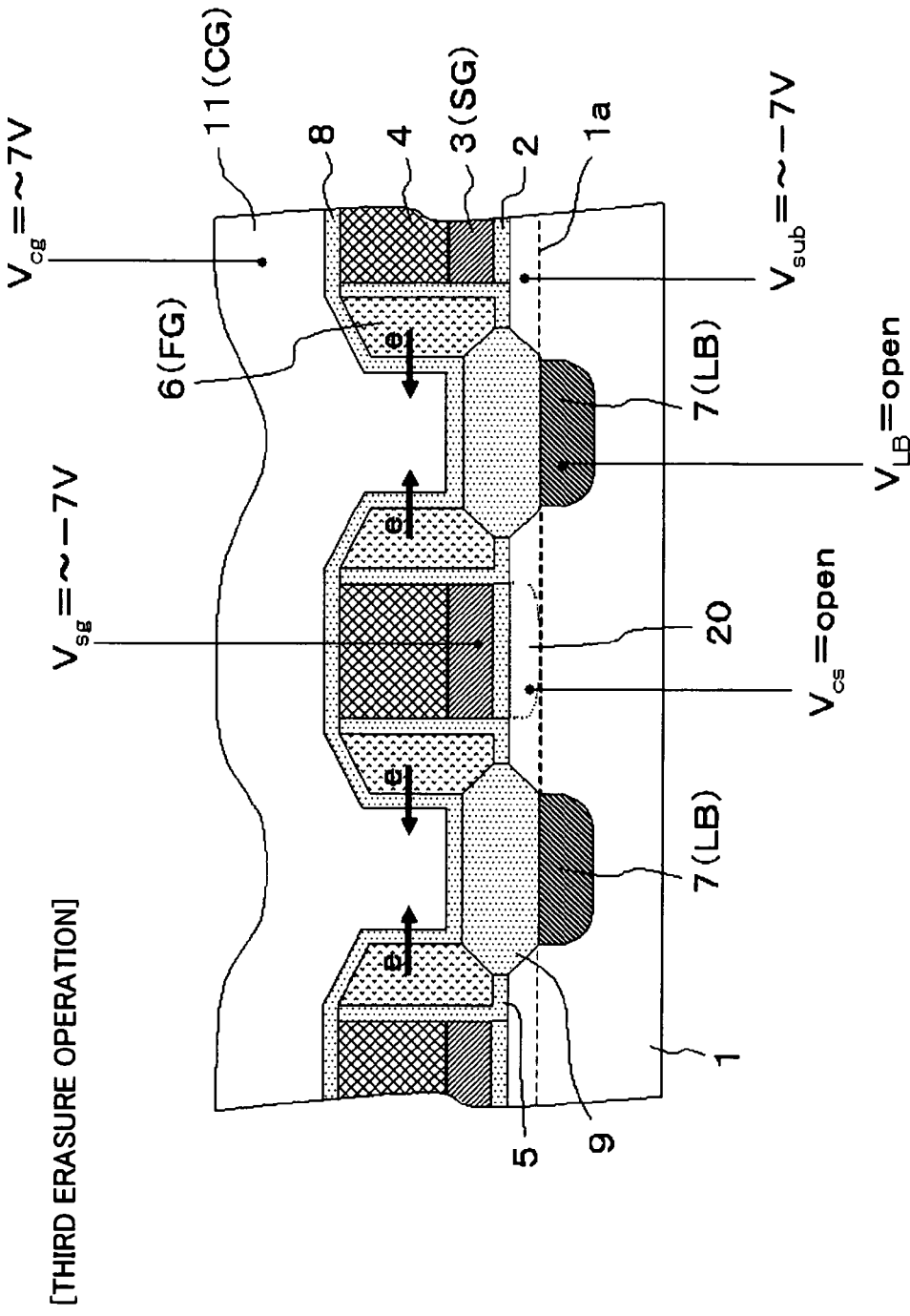
FIG. 6 is a schematic view for illustrating a third erasure operation of the semiconductor memory device according to the first example of the present invention.

The operation for erasure of the semiconductor memory device according to the first example will now be described with reference to the drawings. FIG. 4 is a schematic view for illustrating a first erasure operation of the semiconductor memory device according to the first example. FIG. 5 is a schematic view for illustrating a second erasure operation of the semiconductor memory device according to the first example. FIG. 6 is a schematic view for illustrating a third erasure operation of the semiconductor memory device according to the first example.

Figure 8:
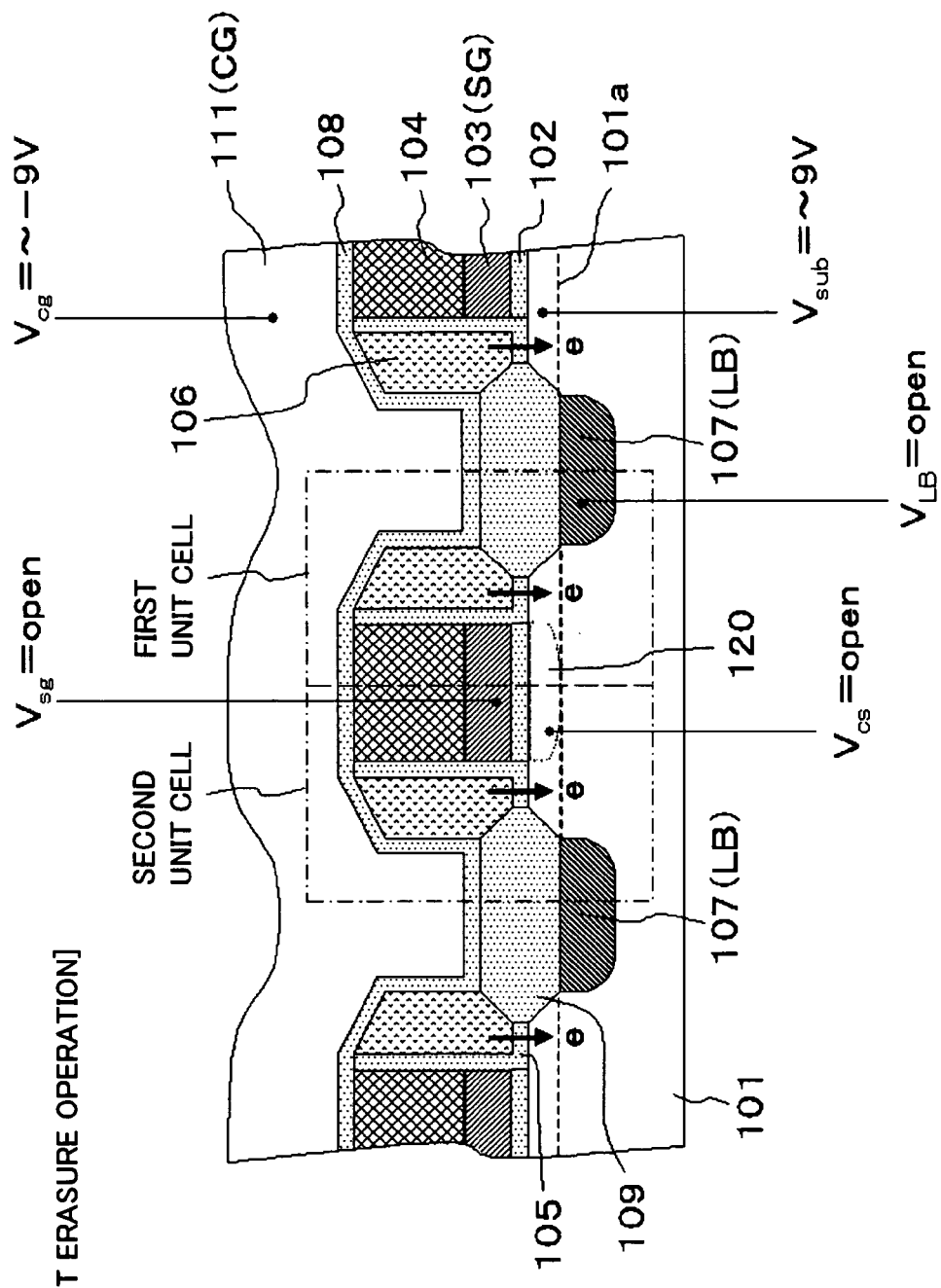
FIG. 8 is a schematic view for illustrating a first erasure operation of the semiconductor memory device according to a related art 1, analyzed by the present invention.

Referring to FIG. 4, in the first erasure operation, a negative high voltage is applied to the control gate 11 and to the select gate 3, and a positive high voltage is applied to the substrate 1 (well 1a) or to the first diffusion region 7. For example, a voltage $V_{cg}=-7V$ is applied to the control gate 11, a voltage $V_{sg}=-7V$ is applied to the select gate 3, and a voltage $V_{sub}=7V$ is applied to the substrate 1 (well 1a), with the first diffusion region 7 being open. By so doing, electrons e are extracted by tunneling from the floating gate 6 to the substrate 1 (well 1a) or to the first diffusion region 7. It is noted that the first erasure operation, described above, differs from the first erasure operation according to the related art 1 (see FIG. 8) in that not only the capacitive coupling between the floating gate and the control gate 11 but also the capacitive coupling between the floating gate and the select gate 3 is used in extracting the electrons e from the floating gate 6.

Figure 9:
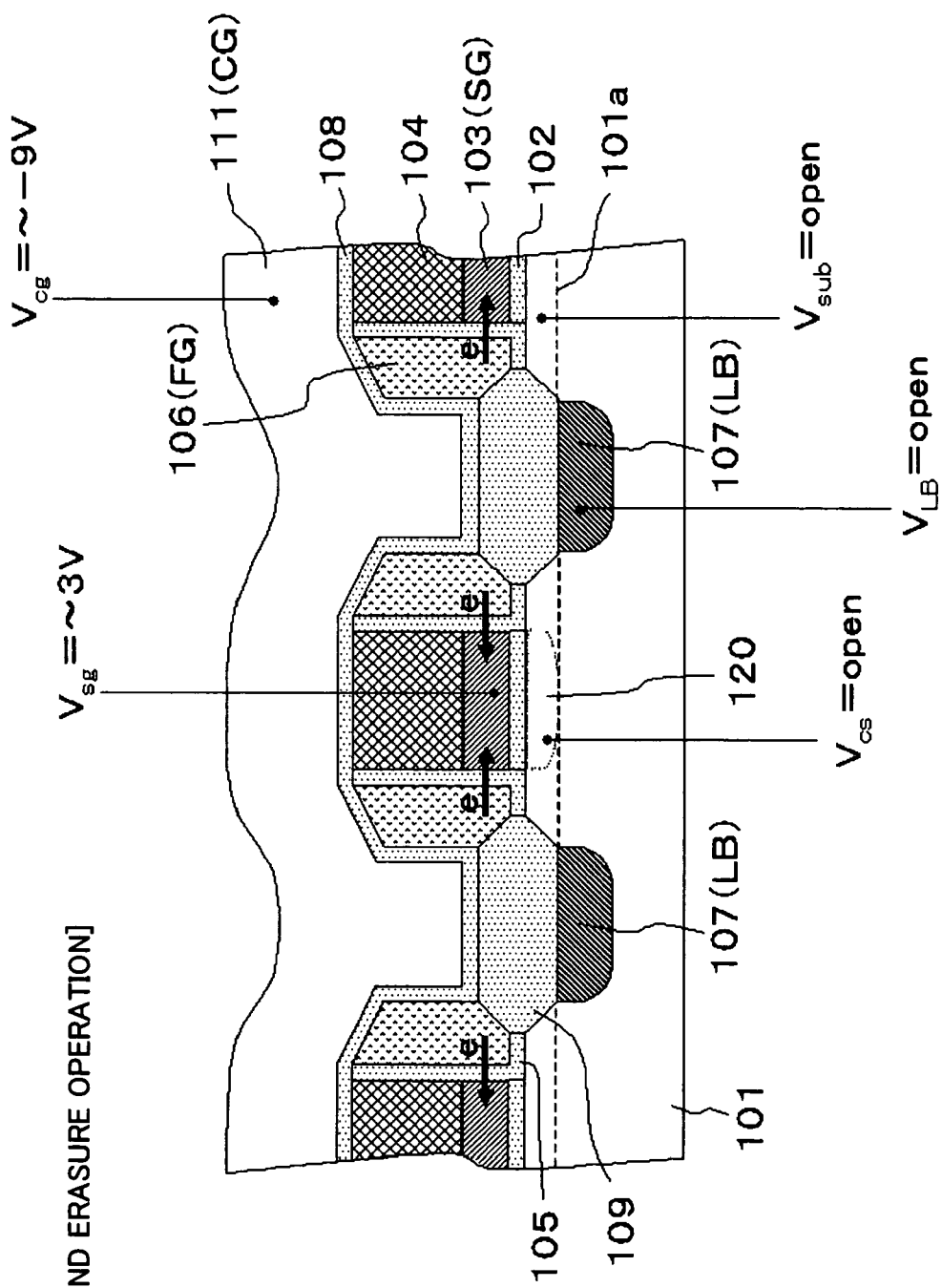
FIG. 9 is a schematic view for illustrating a second erasure operation of the semiconductor memory device according to the related art 1, analyzed by the present invention.

Referring to FIG. 5, during the second erasure operation, a negative high voltage is applied to the control gate 11 and to the substrate 1 (well 1a) or to the first diffusion region 7, and a positive high voltage is applied to the select gate 3. For example, a voltage $V_{cg}=-7V$ is applied to the control gate 11, a voltage $V_{sg}=7V$ is applied to the select gate 3, and a voltage $V_{sub}=-7V$ is applied to the substrate 1 (well 1a), with the first diffusion region 7 being open. By so doing, electrons e are extracted by tunneling from the floating gate 6 to the select gate 3. It is noted that the first erasure operation, described above, differs from the second erasure operation according to the related art 1 (FIG. 9) in that not only the capacitive coupling between the floating gate and the control gate 11 but also the capacitive coupling between the floating gate and the substrate 1 (well 1a) is utilized in extracting the electrons e from the floating gate 6.

Referring to FIG. 6, during the third erasure operation, a negative high voltage is applied to the select gate 3 and to the substrate 1 (well 1a) or to the first diffusion region 7, and a positive high voltage is applied to the control gate 11. For example, a voltage $V_{cg}=7V$ is applied to the control gate 11, a voltage $V_{sg}=-7V$ is applied to the select gate 3, and a voltage $V_{sub}=-7V$ is applied to the substrate 1 (well 1a), with the first diffusion region 7 being open. By so doing, electrons e are extracted by tunneling from the floating gate 6 to the control gate 11. Here, the capacitive coupling between the floating gate and the select gate 3 and that between the floating gate and the substrate 1 (well 1a) are utilized in extracting electrons e from the floating gate 6.

Figure 7:
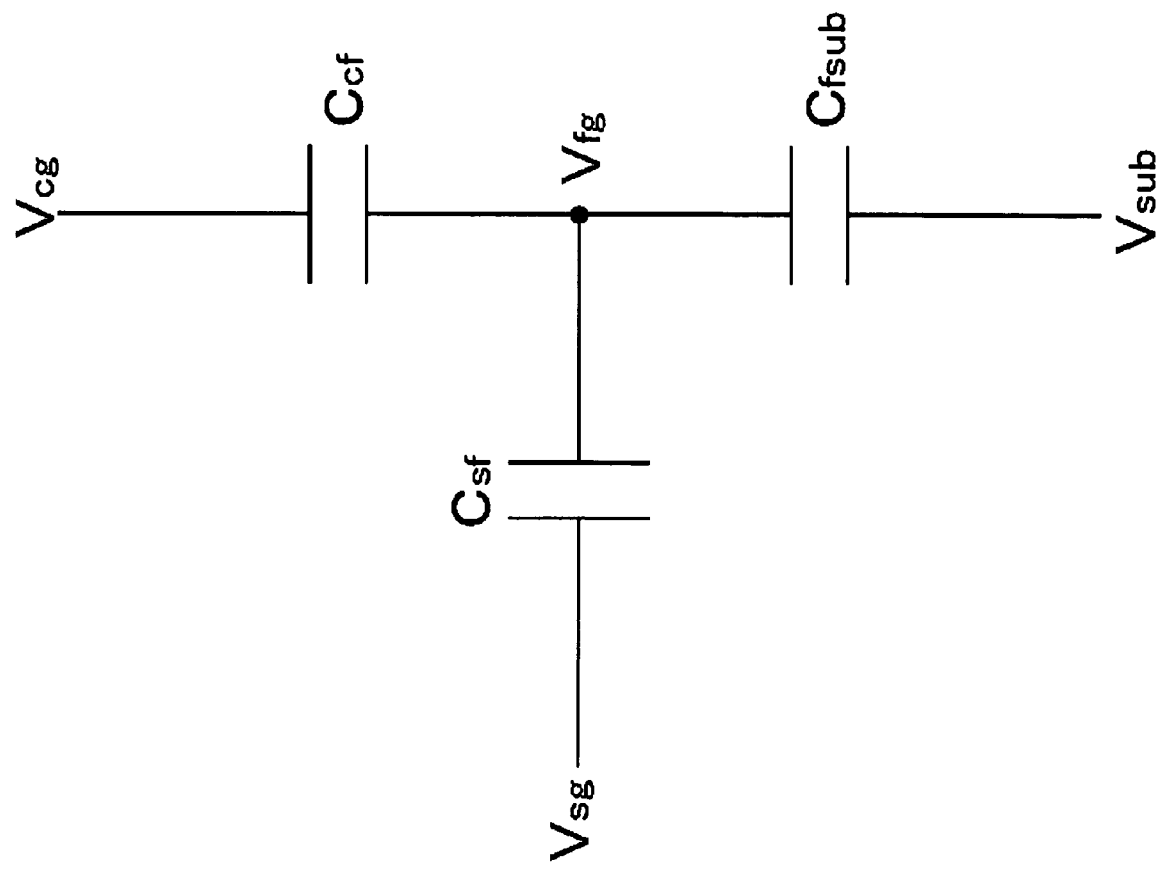
FIG. 7 is a schematic view for illustrating an electrical state of a floating gate of the semiconductor memory device according to the first example of the present invention.

The electrical state of the floating gate 6 during the first to third erasure operations is as shown in FIG. 7. With the first example, two out of the voltages $V_{sg}$, $V_{cg}$ and $V_{sub}$ are made negative, with the remaining one voltage being made positive. Meanwhile, in place of applying a voltage to the substrate 1 (well 1a), it is possible to apply a voltage of the same polarity as that of the voltage applied to the substrate 1 (well 1a) to the first diffusion region 7, or to apply the voltage of the same polarity to both the substrate 1 or well 1a and the first diffusion region 7. The potential $V_{fg}$ of the floating gate 6 may be calculated from the following equation 3:

$$Vfg = \frac{Q}{Call} + \frac{Ccf}{Call}Vcg + \frac{Csf}{Call}Vsg + \frac{Cfsub}{Call}Vsub \quad \text{[Equation 3]}$$

-continued
$$Call = Ccf + Csf + Cfsub$$

where Q is the quantity of electricity of the floating gate 6, $C_{cf}$ is the capacitance across the control gate 11 and the floating gate 6, $C_{fsub}$ is the capacitance across the floating gate 6 and the substrate 1, and $C_{sf}$ is the capacitance across the select gate 3 and the floating gate 6.

According to the first example, it is possible to use lower voltages as the voltages applied to the select gate 3, the voltage applied to the substrate 1 (well 1a) or the first diffusion region 7, or the voltage applied to the control gate 11, upon extracting electrons from the floating gate 6. By using lower voltages, it becomes possible to reduce the size of the peripheral circuit. The reason is that, by three capacitive couplings, namely the capacitive coupling between the control gate 11 and the floating gate 6, the capacitive coupling between the select gate 3 and the floating gate 6 and the capacitive coupling between the substrate 1 (well 1a) or the first diffusion region 7 and the floating gate 6, it is possible to generate a voltage and electrical field such that electrons e may be extracted towards the substrate at a lower applied voltage(s). Moreover, the erasure operation can be raised in speed if the voltage applied to the control gate 11 is increased.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
    a select gate arranged in a first region on a substrate;
    a storage node arranged in a second region neighboring to said first region;
    a first diffusion region provided in a third region neighboring to said second region;
    a control gate arranged above said storage node and said select gate; and
    a driving circuit that controls voltages applied to said substrate, said select gate, said first diffusion region and said control gate;
    wherein said driving circuit exercises control so that, during an erasure operation, two of three voltages, that is, a voltage applied to said substrate and said first diffusion region, a voltage applied to said select gate, and a voltage applied to said control gate, will be negative, and the remaining voltage will be positive.

2. The semiconductor memory device according to claim 1 wherein said driving circuit exercises control so that, during the erasure operation, the voltages of said select gate and said control gate will be negative, and the voltage of said substrate and said first diffusion region will be positive.

3. The semiconductor memory device according to claim 1 wherein said driving circuit exercises control so that, during the erasure operation, the voltage of said substrate and said first diffusion region and the voltage of said control gate will be negative and the voltage of said select gate will be positive.

4. The semiconductor memory device according to claim 1 wherein said driving circuit exercises control so that, during the erasure operation, the voltage of said select gate and the voltage of said substrate and said first diffusion region will be negative, and the voltage of said control gate will be positive.

5. The semiconductor memory device according to claim 1, wherein said substrate comprises a well disposed below said select gate and said storage node.

6. The semiconductor device according to claim 1, further comprising a first insulating film stacked on said select gate.

7. The semiconductor device according to claim 6, wherein said storage node comprises a first floating gate formed on a first side of said first insulating film and said select gate and a second floating gate formed on a second side of said first insulating film and said select gate.

8. The semiconductor device according to claim 1, wherein said select gate comprises a pair of select gate sections.

9. The semiconductor device according to claim 8, wherein each of said select gate sections comprises a comb shape comprising a plurality of comb-shape teeth portions and a plurality of gaps disposed between said teeth portions, and wherein each of said teeth portions of a first of said pair of select gate sections intrudes into said plurality of gaps of a second of said pair of select gate sections.

10. The semiconductor device according to claim 1, further comprising a second diffusion region disposed perpendicular to said first diffusion region.

11. The semiconductor device according to claim 1, wherein, during the erasure operation, a capacitive coupling is formed between said control gate and said storage node.

12. The semiconductor device according to claim 1, wherein, during the erasure operation, a capacitive coupling is formed between said select gate and said storage node.

13. The semiconductor device according to claim 1, wherein, during the erasure operation, a capacitive coupling is formed between said substrate and said storage node.

14. The semiconductor device according to claim 1, wherein, during the erasure operation, a capacitive coupling is formed between said control gate and said storage node, a capacitive coupling is formed between said select gate and said storage node, and a capacitive coupling is formed between said substrate and said storage node.

15. A method of performing an erasure operation by a semiconductor memory device, comprising:

applying a first voltage to at least a portion of a substrate;

applying a second voltage to a select gate, the select gate being arranged on the substrate; and applying a third voltage to a control gate, the control gate being arranged on the substrate above said select gate, wherein two of the first voltage, the second voltage, and the third voltage are negative, and a remaining voltage is positive.

16. The method according to claim 15, further comprising applying a fourth voltage to a diffusion region, the diffusion region being arranged adjacent the select gate.

17. The method according to claim 16, wherein a polarity of the first voltage is the same as a polarity of the second voltage.

18. The method according to claim 15, wherein the at least a portion of the substrate comprises one of the substrate and a well formed within the substrate.

19. The method according to claim 15, wherein the second voltage and the third voltage are negative, and the first voltage is positive.

20. A semiconductor memory device comprising:

a select gate arranged on a substrate;

a storage node arranged adjacent to said select gate;

a first diffusion region arranged adjacent to said storage node; and a control gate arranged above said storage node and said select gate; and wherein, during an erasure operation, two of three voltages, that is, a voltage applied to at least a portion of said substrate, a voltage applied to said select gate, and a voltage applied to said control gate, will be negative, and a remaining voltage will be positive.

21. A semiconductor memory device, comprising:

a select gate arranged in a first region above a substrate;

a storage node arranged in a second region adjacent to said first region;

a first diffusion region provided in a third region adjacent to said second region;

a control gate arranged above said storage node and said select gate; and a driving circuit that controls voltages applied to said substrate, said select gate, said first diffusion region and said control gate, wherein said driving circuit exercises control so that, during an erase operation, two of three voltages, the three voltages including a voltage applied to said substrate or said first diffusion region, a voltage applied to said select gate, and a voltage to said control gate, will be negative, and a remaining voltage of the three voltages will be positive.

* * * * *